United States Patent
Spencer et al.

(10) Patent No.: US 6,992,003 B2
(45) Date of Patent: Jan. 31, 2006

(54) INTEGRATION OF ULTRA LOW K DIELECTRIC IN A SEMICONDUCTOR FABRICATION PROCESS

(75) Inventors: Gregory S. Spencer, Pflugerville, TX (US); Kurt H. Junker, Austin, TX (US); Jason A. Vires, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 223 days.

(21) Appl. No.: 10/659,885

(22) Filed: Sep. 11, 2003

(65) Prior Publication Data

US 2005/0059245 A1 Mar. 17, 2005

(51) Int. Cl.
 *H01L 21/302* (2006.01)
(52) U.S. Cl. ............... 438/638; 438/692; 438/694; 438/700; 438/780; 438/789
(58) Field of Classification Search ............... 438/638, 438/687, 692, 694, 700, 704, 751, 780, 789
See application file for complete search history.

(56) References Cited

U.S. PATENT DOCUMENTS

| | | | |
|---|---|---|---|
| 6,153,512 A | 11/2000 | Chang et al. | |
| 6,197,704 B1 | 3/2001 | Endo et al. | |
| 6,303,525 B1 | 10/2001 | Annapragada | |
| 6,331,480 B1 | 12/2001 | Tsai et al. | |
| 6,348,407 B1 | 2/2002 | Gupta et al. | |
| 6,383,913 B1 | 5/2002 | Tsai et al. | |
| 6,383,950 B1 * | 5/2002 | Pangrle et al. | 438/778 |
| 6,440,878 B1 | 8/2002 | Yang et al. | |
| 6,455,443 B1 | 9/2002 | Eckert et al. | |
| 6,465,372 B1 | 10/2002 | Xia et al. | |
| 6,472,335 B1 | 10/2002 | Tsai et al. | |
| 6,486,061 B1 | 11/2002 | Xia et al. | |
| 6,602,779 B1 * | 8/2003 | Li et al. | 438/622 |
| 6,764,774 B2 * | 7/2004 | Grill et al. | 428/641 |
| 2005/0023689 A1 * | 2/2005 | Nicholson et al. | 257/758 |

* cited by examiner

*Primary Examiner*—George A. Goudreau
(74) *Attorney, Agent, or Firm*—Joseph P. Lally

(57) ABSTRACT

A backend semiconductor fabrication process includes forming an interlevel dielectric (ILD) overlying a wafer substrate by forming a low K dielectric (K<3.0) overlying the substrate of the wafer, forming an organic silicon-oxide glue layer overlying the low K dielectric, and forming a CMP stop layer dielectric overlying the glue layer dielectric. A void is then formed in the ILD, a conductive material is deposited to fill the void, and a polish process removes the excess conductive material. Forming the glue layer dielectric and the CMP stop layer dielectric is achieved by forming a CVD plasma using an organic precursor and an oxygen precursor and maintaining the plasma through the formation of the glue layer dielectric and the stop layer. The flow rate of the organic precursor is reduced relative to the oxygen precursor flow rate to form a CMP stop layer that is substantially free of carbon.

24 Claims, 2 Drawing Sheets

INTEGRATION OF ULTRA LOW K DIELECTRIC IN A SEMICONDUCTOR FABRICATION PROCESS

FIELD OF THE INVENTION

The present invention is in the field of semiconductor devices and more particularly in the field of semiconductor fabrication processes employing low K dielectrics.

RELATED ART

In the field of semiconductor fabrication, the use of dielectric materials having a low dielectric constant (low K materials) is well known. Low K dielectrics are used primarily in backend processing. Backend processing refers generally to processing subsequent to the formation of transistors in the wafer substrate to connect the transistors (typically with multiple levels of interconnects). Each interconnect level is separated by an interlevel dielectric (ILD). The individual interconnects within a single interconnect level are also separated by a dielectric material that may or may not be the same as the ILD. Vias or contacts are formed in the ILD's and filled with conductive material to connect the interconnect levels in a desired pattern to achieve a desired functionality.

The spacing between adjacent interconnects within an interconnect level and the spacing between vertically adjacent levels have both decreased as device complexity and performance have increased. Minimizing cross coupling between the many signals within a device is now a significant design consideration. The primary source of signal cross coupling or cross talk is capacitive. A pair of adjacent interconnect (whether within a single interconnect level or in vertically adjacent interconnect levels) separated by an intermediate dielectric material form an unintended parallel plate capacitor. Minimizing cross coupling requires a minimization of the capacitance between any pair of adjacent interconnects, especially those interconnects that carry signals that switch a high frequency.

One popular approach to minimizing cross talk includes the use of low K dielectric materials as the ILD. Low K materials reduce cross talk because the capacitance of a parallel plate capacitor is directly proportional to the dielectric constant of the material between the capacitor plates. A lower dielectric constant material translates into lower capacitance and lower cross coupling.

Various low K materials have been used in low K backend processing with mixed results. Integration of low K material into existing fabrication processes is particularly challenging in the case of backend processing that includes the use of chemical mechanical polishing (CMP). CMP is a technique by which each interconnect level is formed in many existing processes. In a CMP process, as implied by its name, a film or layer is physically polished with a rotating polishing pad in the presence of a "slurry" that contains mechanical abrasion components and/or chemical components to produce a smooth upper surface and to remove excess conductive material and thereby isolate the individual interconnects from one another.

Low K materials are generally not easily integrated into a CMP-based backend process. Low K materials tend to exhibit dishing and erosion and other forms of deterioration under chemical mechanical polishing and are susceptible to slurry penetration into the Low K material. To combat this problem, capping materials have been formed over the low K dielectrics to act as a CMP stop. Unfortunately, adhesion between many materials used as low K materials and other materials suitable for use as a CMP stopping layer is often not good. It would be desirable, therefore, to implement a process integrating low K ILD's into a CMP backend process flow.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the present invention contemplates a semiconductor fabrication process in which low K dielectric materials are used in the backend fabrication of a semiconductor device by including a deposition technique in which a capping layer suitable for use as a CMP stopping layer is adhered to the underlying, low K material using an intervening "glue" layer. Adhesion between the glue layer and the capping layer is achieved in one implementation by depositing both layers by CVD techniques using a continuous plasma (i.e., no break in plasma between the first layer and the second layer). The resulting structure includes a top film suitable for use as a CMP stop layer that adheres to an underlying ultra low K dielectric thereby achieving the desired reduction in capacitive coupling without sacrificing the reliability of the ILD structure.

Figure 1:
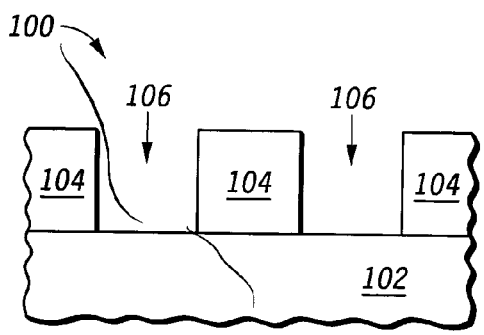
FIGS. 1–4 are partial cross sectional views of selected stages of a prior art semiconductor fabrication process.
Figure 2:
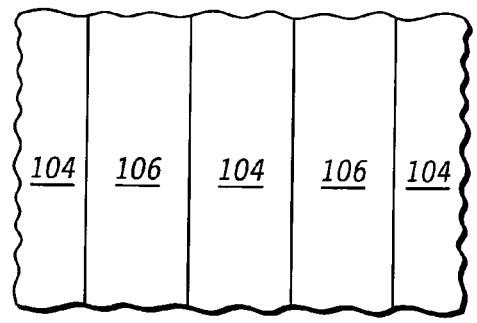

Turning now to the drawings, FIGS. 1–4 present a conventional process flow for a CMP backend process. In the depicted process, an ILD 104 is formed over a semiconductor substrate 102 of a semiconductor wafer (FIG. 1). Substrate 102 will typically include another ILD layer having metal level or via level conductive lines. ILD 104 is typically formed by depositing a dielectric over substrate 102, patterning photoresist over the ILD, etching ILD 104 to form voids 106 where a subsequent interconnect or via (contact) will be located. FIG. 2 is a top view of wafer 100 showing a pair of voids 106 extending parallel to each other across portions the wafer surface as is typical of interconnects and is characteristic of interconnects that may experience or exhibit capacitive cross coupling.

Figure 3:
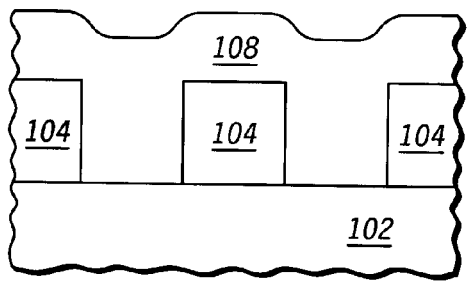
Figure 4:
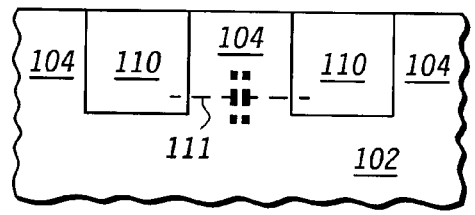

In FIG. 3, a conductive material 108 such as copper or aluminum is deposited over the wafer surface to fill voids 106. The deposition process leaves conductive material outside of the channels defined by voids 106 such that each of the voids is electrically connected by the conductive material following deposition. To isolate individual interconnects from one another, a CMP process is employed to remove the portions of material 108 exterior to the voids 106 and thereby form interconnects 110. As will be appreciated, the CMP process proceeds until the upper surface of ILD 104 is encountered. To ensure the isolation of the various interconnects, the CMP process typically polishes into (i.e., removes) an upper portion of ILD 104. The ILD 104 must, therefore, be capable of being polished without breaking down structurally.

An unintended parallel plate capacitor 111 is formed during the formation of the interconnect. Capacitor 111 is referred to as an intralevel capacitor that includes adjacent interconnects as its "plates" and the intermediate ILD as the capacitor dielectric. Capacitor 111 limits the speed at which signals on adjacent interconnects 110 can switch with respect to each other and can induce signal changes in the interconnects. The capacitance of capacitor 111 is roughly proportional to the dielectric constant of ILD 104 and inversely proportional to the displacement between adjacent interconnects. As the displacement decreases in advanced semiconductors, the capacitor value the resulting limitations on device performance increase. In addition to intralevel capacitors such as capacitor 111, interlevel capacitors are formed between ILD 104 and one or underlying interconnect levels in the substrate 102. These interlevel capacitors also contribute to performance degradation although, typically, to a lesser extent than the intralevel capacitors.

The present invention addresses capacitive coupling in advanced semiconductor devices by using an ultra low K (ULK) dielectric as the primary backend dielectric and integrating the ULK into a backend process flow that includes one or more polishing steps by capping the ULK with a capping layer capable of withstanding the mechanical rigors of a conventional CMP process.

Returning to the drawings, FIGS. 5–10 depict selected steps in a fabrication process sequence for forming a CMP-compatible, ULK dielectric film according to one embodiment of the present invention. The dielectric film is equally suitable for use as an interlevel dielectric that isolates the interconnects in vertically adjacent interconnect levels and as an intra-level dielectric that isolates the interconnects within a single interconnect level. In either case, the film may be referred to herein as an ILD for the sake of brevity.

Figure 5:
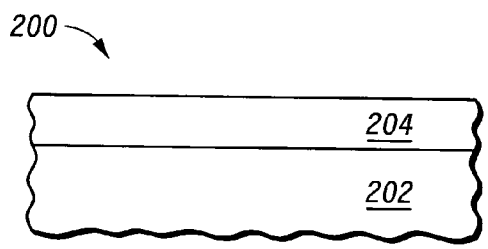
FIGS. 5–10 are partial cross-sectional views of selected stages of a semiconductor fabrication process according to one embodiment of the present invention.

In FIG. 5, a first dielectric layer 204 is formed overlying a substrate 202 of a semiconductor wafer 200. Substrate 202 includes all structures formed during "front end" processing and all previously formed interconnect levels and their corresponding dielectric films. Thus, substrate 202 of FIG. 5 likely includes (although not depicted) a bulk silicon portion, doped silicon regions and other structures (such as transistor gate structures) defining transistors, and all previously formed interconnect levels. Thus, the upper surface of substrate 202 may include electrically conductive portions such as a via or interconnect and electrically insulating portions such as the last ILD formed.

First dielectric layer 204 is, in an embodiment designed to minimize capacitive coupling, a low K material and, even more desirably, an ultra low K (ULK) dielectric. For purposes of this disclosure, a ULK dielectric is a dielectric having a dielectric constant of 3.0 or less. ULK materials include spin on dielectrics such as the silsesquioxane-based LKD-5109 dielectric material from JSR Corporation and CVD films including OctaMethylCycloTetra Siloxane (OM-CTS)-based materials such as the "Black Diamond II" films from Applied Materials. In an embodiment, suitable for use with a 130 or 90 nm fabrication process, first dielectric 204 has a thickness in the range of approximately 2000 to 5000 Angstroms.

Figure 6:
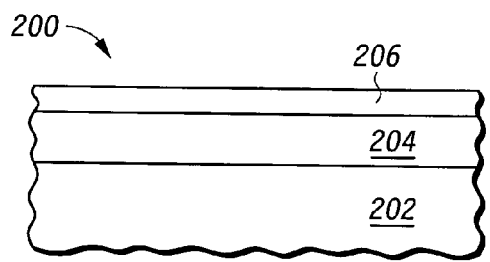
Figure 7:
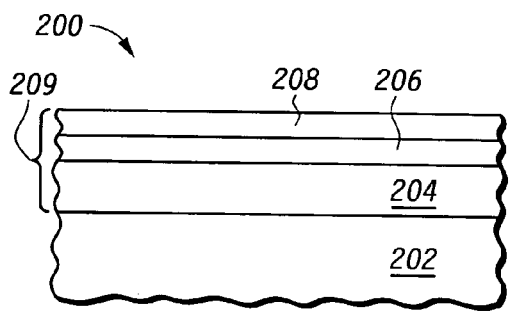

While the low K value of first dielectric layer 204 is desirable for reducing parasitic capacitance, the likely candidates for use as first dielectric 204 are not sufficiently mechanically stable to provide an etch stop for a subsequent CMP process. Accordingly, it is necessary to deposit at least one capping layer over first dielectric layer 204 to achieve a reliable ILD structure. Referring now to FIG. 6 and FIG. 7, a second dielectric 206 is formed overlying first dielectric 204 and a third dielectric layer 208 is formed over second dielectric layer 206 to form an ILD 209 including first, second, and third dielectrics 204, 206, and 208. From a functional perspective, third dielectric layer 208 serves as the capping layer having the needed ability to provide a CMP stop layer. Because the most likely candidates for first and third dielectrics 204 and 208 do not adhere well to each other, second dielectric 206 is provided to provide an adhering "glue" layer between the CMP stop layer (208) and the ULK layer (204).

In one embodiment, second dielectric layer 206 is an organic silicon-oxide film. Second dielectric 206, according to one embodiment, is formed by reacting an oxygen bearing species and a second species that includes silicon, hydrogen, and carbon in a plasma enhanced chemical vapor deposition chamber reactor. The second species may be derived from a precursor such as tetramethylsilane (4MS) or trimethylsilane (3MS). When reacted in a CVD chamber with oxygen under appropriate deposition conditions, the 4MS/3MS precursor deposits as a SiCOH film 206 overlying ULK film 204. For use in 130 and 90 nm technologies, second dielectric layer 206 has a thickness in the range of approximately 200 to 800 angstroms. In this embodiment, the SiCOH second dielectric film 206 adheres well to ULK first dielectric film 204, but is not suitable for use as a CMP stop layer. A capping layer is needed that can adhere to second dielectric layer 206 and is capable of providing a suitable stopping layer for a CMP of copper (or other conductive material).

As shown in FIG. 7, third dielectric layer 208 is deposited over second dielectric 206. In one embodiment suitable for use with a SiCOH second dielectric layer 206, third dielectric layer is a silicon oxide film formed in a CVD reactor chamber using the same first and second species as the CVD process used to form SiCOH second dielectric 206. In one such implementation, third dielectric layer 208 is formed by reacting an oxygen bearing species and a silicon, hydrogen, and carbon bearing species in a plasma enhanced CVD reactor chamber. Third dielectric layer 208 has, in one embodiment, a thickness in the range of approximately 500 to 2000 angstroms.

Figure 11:
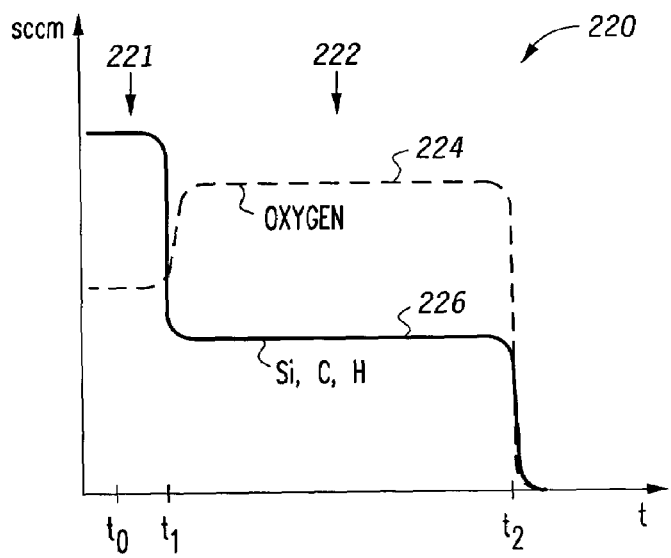
FIG. 11 is a conceptual illustration of a deposition process suitable for use in one embodiment of the present invention.

In one embodiment theorized to improve the adhesion and reliability of ILD 209, the formation of second and third dielectric layers 206 and 208 is achieved with a deposition process in which the flow rates of the precursors are manipulated while maintaining a plasma (glow discharge) within the chamber. This particular embodiment is conceptually illustrated in FIG. 11, which graphs the flow rates (in sccm's) of a first precursor 224 and a second precursor 226 as a function of time during a plasma deposition process 220 suitable for forming second and third dielectric layers 206 and 208.

In the depicted process, first precursor 224 is an oxygen bearing precursor such as $O_2$ and second precursor 226 includes silicon, hydrogen, and carbon. Exemplary second precursors include 4MS and 3MS. During a first duration (221) of the process, extending from $t_0$ to $t_1$, the flow rate of second precursor exceeds the flow rate of first precursor (222). At the termination of the first duration (221), a second duration (222) commences during which the flow rate of first precursor 224 exceeds the flow rate of second precursor 226. In the preferred embodiment, a continuous plasma discharge is maintained during first and second durations 221 and 222 by maintaining uninterrupted radio frequency power during first and second durations 221 and 222. Following the second duration 222, the flow of first and second precursors 224 and 226 is terminated. In one embodiment, the chamber temperature and rf power are constant throughout first duration 221 and second duration 222.

In one exemplary process recipe, the flow rate of O2 first precursor 224 is 220 sccm's during first duration 221 and 940 sccm's during second duration 222, the flow rate of TMS second precursor 226 is 1040 sccm's during first duration 221 and 480 sccm's during second duration 222. The chamber is maintained at a constant temperature, in the range of approximately 300 to 400° C., and a constant pressure and rf power.

During first duration 221, when the organic second precursor 226 is plentiful, organic second dielectric layer 206 is formed. When the organic precursor flow rate is reduced during second duration 222, third dielectric 208 is formed as an oxide that is substantially free of carbon, although it is derived from an organic precursor. It is theorized that, by maintaining a continuous vacuum and glow discharge during the formation of second and third dielectric layers 206 and 208 results in an interface that is reliable and exhibits sufficient adhesion. The resulting three-layer ILD 203 (comprising layers 204, 206, and 208) provides an adequate stopping layer for a subsequent CMP processes while achieving a structure with an overall lower dielectric constant that exhibits adequate reliability and adhesion.

Figure 8:
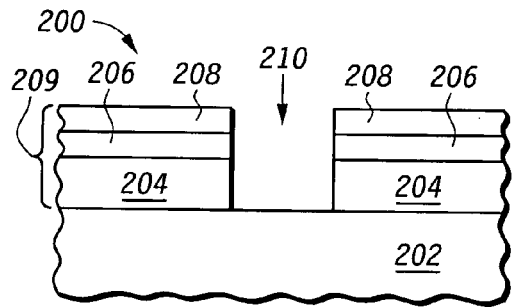
Figures 9, 10:
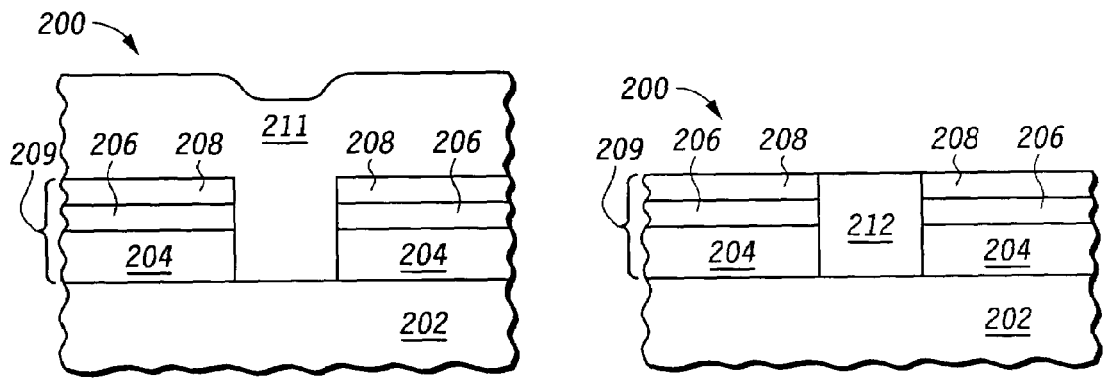

Referring now to FIGS. 8 through 10, an interconnect level is formed after formation of ILD 203. In FIG. 8, a void 210 is etched into ILD 203 using conventional photolithographic, photoresist, and etch processing. A conductive material 211, exemplified by copper, is deposited in a conventional manner to fill void 210. The portions of conductive material 211 that are exterior to void 210 are then removed with a CMP process that terminates on third dielectric layer 208. Depending upon the implementation the CMP process leaves all, some, or substantially none of layer 208 after completion.

In the foregoing specification, the invention has been described with reference to specific embodiments. However, one of ordinary skill in the art appreciates that various modifications and changes can be made without departing from the scope of the present invention as set forth in the claims below. For example, the semiconductor substrate of FIG. 1 may be implemented with conventional silicon bulk wafers, silicon-on-insulator (SOI) wafers, as well as non-silicon alternatives such as germanium and various III–V compounds. The conductive material could comprise a metal interconnnect level, a via interconnect, or a combination of both. The first, second, and third dielectric layers 204, 206, and 208, may be different materials than those disclosed herein. Similarly, the precursors used may be different than the precursors disclosed and the precise deposition parameters may vary with implementation including wafer size and deposition tool. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process, comprising:
   forming an ILD overlying a substrate of a semiconductor wafer wherein forming the ILD comprises:
      forming a low K dielectric overlying a semiconductor substrate of the wafer, wherein a dielectric constant of the low K dielectric is less than or equal to 3.0;
      forming an organic, silicon-oxide, glue layer dielectric overlying the low K dielectric including forming a plasma within a CVD reactor chamber using a specified set of precursors including a carbon bearing precursor and maintaining the plasma during formation of the glue layer dielectric; and
      forming a CMP stop layer dielectric overlying the glue layer dielectric including reducing a flaw rate of the carbon bearing precursor following formation of the glue layer dielectric while continuing to maintain the plasma to form the CMP stop layer dielectric wherein the CMP stop layer dielectric is substantially free of carbon;
   forming a void in the ILD;
   depositing a conductive material over the wafer to fill the void; and
   removing portions of the conductive material exterior to the void by polishing the wafer with a CMP process and terminating the CMP process on the CMP stop layer dielectric.

2. The method of claim 1, wherein the specified set of precursors includes an oxygen bearing precursor and a second precursor selected from tetramethylsilane (4MS) and trimethylsilane (3MS).

3. The method of claim 2, wherein a ratio of the oxygen precursor flow rate to the second precursor flow rate is less than 1:2 while forming the glue layer dielectric and further wherein the ratio exceeds 2:1 while forming the CMP stop layer dielectric.

4. The method of claim 3, wherein the reactor chamber temperature and pressure are maintained at constant during the formation of the glue layer dielectric and the CMP stop layer dielectric.

5. The method of claim 1, wherein forming the low K dielectric comprises spinning on a low K material.

6. The method of claim 1, wherein forming the low K dielectric comprises depositing an OctaMethylCycloTetra Siloxane (OMCTS) material.

7. A method of forming an ILD overlying a substrate of a semiconductor wafer, comprising:
   forming a first dielectric having a dielectric constant less than or equal to 3.0 overlying the substrate;
   depositing, with a chemical vapor deposition process, second and third dielectrics overlying the first dielectric, wherein forming the second and third dielectrics comprises forming a plasma from an oxygen bearing precursor and an organic precursor, maintaining the flow rates of the precursors at first flow rates while forming the second dielectric, and thereafter, reducing the relative flow rate of the organic precursor while maintaining the plasma to form the third dielectric.

8. The method of claim 7, wherein forming the first dielectric comprises spinning on a silsesquioxane-based film.

9. The method of claim 7, wherein forming the first dielectric comprises depositing an OctaMethylCycloTetra Siloxane (OMCTS)-based film.

10. The method of claim 7, wherein the second dielectric comprises an organic silicon-oxide, and further wherein the third dielectric comprises substantially carbon-free silicon-oxide.

11. The method of claim 7, wherein the organic precursor comprises an precursor selected from 3MS and 4MS.

12. The method of claim 11, wherein a ratio of the oxygen precursor flow rate to the organic precursor flow rate is less than 1:2 while forming the second dielectric and further wherein the ratio exceeds 2:1 while forming the third dielectric.

13. The method of claim 12, wherein a temperature and pressure of a reactor chamber of the CVD process remain constant during formation of the second and third dielectrics and further wherein an radio frequency power of the reactor chamber is uninterrupted dining formation of the second and third dielectrics.

14. A semiconductor fabrication process, comprising:
forming a first dielectric having a dielectric constant of less than or equal to 3.0 over a semiconductor substrate;
forming, in a chemical vapor deposition (CVD) reactor chamber using a continuously maintained plasma derived from an oxygen precursor and an organic precursor, a second dielectric overlying, the first dielectric and a third dielectric overlying the second dielectric, wherein the second dielectric comprises an organic silicon-oxide and the third dielectric comprises a substantially carbon free silicon-oxide.

15. The method of claim 14, wherein forming the first dielectric comprises spin depositing a silsesquioxane-based material overlying the substrate.

16. The method of claim 14, wherein forming the first dielectric comprises depositing an OctaMethylCycloTetra Siloxane (OMCTS)-based film overlying the substrate.

17. The method of claim 14, wherein The organic precursor comprises 3MS or 4MS.

18. The method of claim 17, wherein the flow rate of the organic precursor exceeds the flow rate of the oxygen precursor while forming the second dielectric and the organic precursor flow rate is less than the oxygen precursor flow rate during while forming the third dielectric.

19. The method of claim 18, wherein the CVD reactor temperature and pressure are maintained at constant values during formation of the second and third dielectrics.

20. The method of claim 1, wherein the ILD comprises an intralevel dielectric.

21. The method of claim 1, wherein the ILD comprises an interlevel dielectric.

22. The method of claim 1, wherein terminating on the CMP stop layer includes removing a portion of the CMP stop layer.

23. The method of claim 7, wherein ILD comprises an intralevel dielectric.

24. The method of claim 7, wherein ILD comprises an interlevel dielectric.

* * * * *

UNITED STATES PATENT AND TRADEMARK OFFICE
CERTIFICATE OF CORRECTION

| | |
|---|---|
| PATENT NO. | : 6,992,003 B2 |
| APPLICATION NO. | : 10/659885 |
| DATED | : January 31, 2006 |
| INVENTOR(S) | : Gregory S. Spencer et al. |

It is certified that error appears in the above-identified patent and that said Letters Patent is hereby corrected as shown below:

Column 6, Line 20, Claim No. 1:

Change "dielectric including reducing a flaw rate" to --dielectric including reducing a flow rate--

Column 7, Line 9, Claim No. 11:

Change "comprises an precursor selected" to --comprises a precursor selected--

Column 7, Line 18, Claim No. 13:

Change "further wherein an radio frequency power" to --further wherein a radio frequency power--

Column 7, Line 27, Claim No. 14:

Change "a second dielectric overlying, the first" to --a second dielectric overlying the first--

UNITED STATES PATENT AND TRADEMARK OFFICE
CERTIFICATE OF CORRECTION

PATENT NO. : 6,992,003 B2
APPLICATION NO. : 10/659885
DATED : January 31, 2006
INVENTOR(S) : Gregory S. Spencer et al.

It is certified that error appears in the above-identified patent and that said Letters Patent is hereby corrected as shown below:

Column 8, Line 7, Claim No. 17:

Change "wherein The organic" to --wherein the organic--

Signed and Sealed this

Third Day of June, 2008

JON W. DUDAS
*Director of the United States Patent and Trademark Office*